United States Patent [19]

Hochstein

[11] Patent Number: 4,975,964
[45] Date of Patent: Dec. 4, 1990

[54] AUTOMATIC TURN OFF SYSTEM

[76] Inventor: Peter A. Hochstein, 2966 River Valley Dr., Troy, Mich. 48098

[21] Appl. No.: 371,914

[22] Filed: Jun. 27, 1989

[51] Int. Cl.⁵ ............................................. H03G 3/20
[52] U.S. Cl. ..................................... 381/110; 367/198
[58] Field of Search ......................... 381/110; 367/198

[56] References Cited

U.S. PATENT DOCUMENTS

| 4,453,264 | 6/1984 | Hochstein | 381/110 |
| 4,506,377 | 3/1985 | Kishi et al. | 381/110 |
| 4,809,339 | 2/1989 | Shih et al. | 381/110 |

OTHER PUBLICATIONS

"Voice Operated Control Switch", -Elektor, Dec. 1979, vol. 5, pp. 12-40, 12-41.
"Sound Operated Switch", Practical Electronics, May, 1979, vol. 15, No. 5, pp. 46-49.

Primary Examiner—Forester W. Isen
Attorney, Agent, or Firm—Reising, Ethington, Barnard, Perry & Milton

[57] ABSTRACT

An automatic turn-off assembly (10) for supplying and discontinuing power to a device (12) in response to an audio signal. The audio signal is rectified (22) producing a level signal which is compared by a window comparator (26). When the level signal is within the window, a trigger signal is produced to initiate and reset a timer (30), which in turn produces a control signal for a predetermined time while being powered. If the level signal is below the window, the timer (30) is not reset. If the signal is above the window, a muting circuit (44) is initiated to mute the device (12), which is preferably an audio amplifier. The assembly (10) includes a manual push-button switch (18) for initially supplying power to the device (12) and to the timer (30). A relay (RL1) maintains the supply of power in the presence of the control signal and disconnects power from the device (12) and timer (30) after the predetermined time. The device (12) may be manually turned off to disconnect power thereto prior to the expiration of the predetermined time.

43 Claims, 1 Drawing Sheet

AUTOMATIC TURN OFF SYSTEM

TECHNICAL FIELD

The subject invention relates to a signal sensing circuit for sensing the presence of an electrical signal, more specifically, for use in a wireless audio speaker assembly for turning off the speaker system in the absence of the audio signal.

BACKGROUND OF THE INVENTION

Wireless remote speaker systems for high fidelity stereo use are popular due to ease of movement to locations not readily served by conventional wired speakers. For true portability, these remote amplified speakers must be battery powered. Size and weight constraints limit the amphere-hour capacity of built-in rechargeable batteries, so that efficient use of the available power must be a primary concern. One important factor in prolonging battery life is turning the unit off when the audio signals are no longer being received. Leaving the units "on" inadvertently for extended periods of time, not only discharges the batteries, but such deep discharge is harmful to most secondary battery systems.

One type of automotive automatic turn-on and turn-off system is discloses in U.S. Pat. No. 4,453,264 issued June 5, 1984 to the inventor of the subject invention. The input signal is AC coupled to a differential amplifier stage which generates a ground referenced signal. The signal is AC coupled to a voltage comparator. The comparator in each channel is set to develop a positive going output pulse whenever the input exceeds a predetermined level. The output pulses which follow the input signal excursions are OR'ed by diodes and feed an integrator capacitor. The voltage across the integrator capacitor is monitored by a MOSFET switch which in turn, pulls in a power control relay. Typical transistor characteristics allow the device to turn on whenever the voltage across the integrator capacitor reaches a predetermined level. In the absence of any audio input signal, the charge on the capacitor dissipates slowly through a bleeder resistor so as to shut off the FET and drop out the relay after some delay. A problem with this system is that the turn-on sensitivity is linked directly to turn-off time delay. An additional problem with this type of technology is that human hearing being essentially logarithmic in sensitivity can easily detect very low audio levels in the existing speakers if they are used. The auxiliary, amplified speaker should switch on automatically at this low level and not at higher levels where a sudden turn-on could be very annoying. Random audio input line and power line noise may trigger the system to turn on. Reducing the turn-on sensitivity by increasing the comparator set point does render the system more noise immune, but increases the turn-on delay.

A second system is disclosed in an article titled Sound Operated Switch written by Michael Tooley and David Whitfield in Practical Electronics, May 1979 Edition. The article discloses a switch which turns on and off in response to an audio frequency signal. The incoming audio frequency signal is applied to an amplifier stage and then to a unity gain active full wave rectifier. The output excursion of the rectifier is applied to the comparator whose output is used to enable a conventional timer circuit, which is a 555 integrated timer circuit. The article stresses that once the input level has risen sufficiently to trigger the circuit and enable the timer, the output of the monostable will remain high regardless of any subsequent reduction of input level. The problem with this system is that it is not retriggerable during the time delay. The integrated timer circuit receives an input signal and produces an output signal for the predetermined time after which it goes low and waits for another input signal. This could cause blanking out of the speaker.

Battery operated, amplified remote speakers should not turn-on automatically because many stereo speaker pairs could be placed within a building and adjacent spaces and some of these areas would not be occupied at all times. Instead of all remote speakers automatically turning on simultaneously whenever the master transmitter is energized, it is preferable that individual speaker pairs be manually turned on as required.

There are other wireless remote speaker systems on the market which all suffer major drawbacks. They are generally either designed for line of sight use from the remote transmitter (IR LED types) or are not truly wireless, in that they utilize the AC power line for power and current carrier transmission of the audio signal. Being tied to the AC power line strictly limits the possible points of use, but existing battery powered remote speakers simply do not preform adequately mainly because of limited use time per charge.

SUMMARY OF THE INVENTION AND ADVANTAGES

The invention is a method and a signal sensing assembly for sensing audio signals and supplying power and the audio signal to a device in response thereto. The assembly comprises input means for supplying an audio signal, rectifier means for receiving and rectifying said audio signal to produce a level signal, comparator means for receiving the level signal and comparing the level signal to a predetermined magnitude range to produce a trigger signal, timer means for receiving the trigger signal to produce the control signal for a predetermined time while receiving power and preventing the production of the control signal at the expiration of the predetermined time period and in the absence of power, the assembly being characterized by including control means responsive to manual actuation for initially supplying power to a device and the timer means so that the control signal is produced in the presence of the audio signal and for maintaining the supply of power while receiving the control signal and discontinuing power at the expiration of the control signal.

The advantages of the system include an automatic turn off system for remote wireless speakers which shuts down the system and conserves battery power. Absolutely no battery power is consumed once the system is either manually or automatically turned off. Battery operated amplified remote speakers should not turn on automatically because many stereo speaker pairs could be placed within a building an adjacent spaces and some of these would not be occupied at all times. Instead of all remote speakers automatically turning on simultaneously whenever the master transmitter is energized, it is preferable that individual speaker pairs be manually turned-on as required.

BRIEF DESCRIPTION OF THE DRAWINGS

Other advantages of the present invention will be readily appreciated as the same becomes better understood by reference to the following detailed description when considered in connection with the accompanying drawings wherein.

DESCRIPTION OF THE PREFERRED EMBODIMENT

Figure 1:
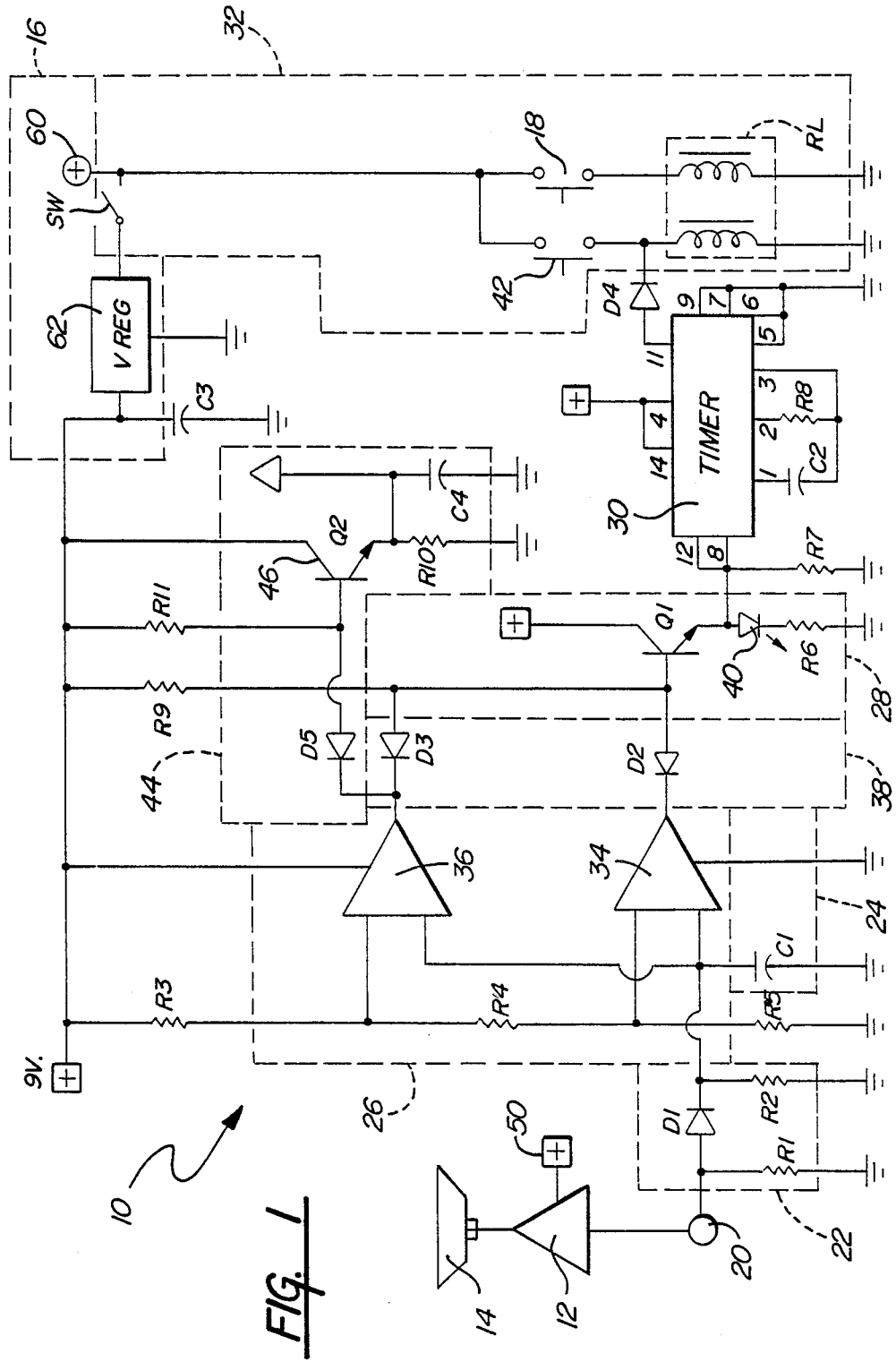
FIG. 1 is a schematic diagram of the subject invention.

A signal sensing assembly for sensing electrical signals and supplying power and the electrical signals to a device in response thereto is generally shown at 10 in FIG. 1. In the preferred embodiment, the assembly 10 is connected to and controls an audio amplifier 12 comprising the device for receiving power and the electrical signal, or audio signal, and producing an amplified audio signal when powered. The amplified audio signal is delivered to an audio transducer 14 for producing an audio output.

The assembly 10 includes battery power means 16 for supplying power to the assembly 10 and amplifier 12. The power supply means 16 allows the assembly 10 and amplifier 12 to be completely remote from any other devices or power supplies. The assembly 10 includes momentary ON actuating means 18 for manually switching and supplying power to the audio amplifier 12. It has been found desirable to manually turn-on the assembly 10 to preserve battery power by preventing auto turn-on of all remote speakers in a given installation. Generally, the audio signal will be initiated and the ON actuating means 18 will be actuated to initially supply power to the audio amplifier 12 and assembly 10. The assembly 10 and amplifier 12 will remain on until the electrical signal is discontinued or as further described herein.

The assembly 10 includes input means 20 for receiving the audio signal. In the preferred embodiment, the input signal is an audio signal but may be any type of electrical signal depending on the device 12 to be controlled. The input means 20 may comprise FM receiving means for receiving radio frequency signals from a remote transmitter, reproducing the transmitted the audio signal. The FM receiver 20 and corresponding transmitter are commonly known in the art.

The assembly 10 includes rectifier means 22 which receives and rectifies the audio signal to produce a d.c. level signal. The rectifier means 22 is a half wave rectifier. The level signal is then filtered by a filter means 24 and sent to comparator means 26. The comparator means 26 recieves the level signal and compares the level signal to a predetermined magnitude range to produce a trigger signal. The trigger signal is received by a driver means 28 for receiving the trigger signal and driving retriggerable timer means 30.

The retriggerable timer means 30 receives the trigger signal to produce a control signal for a predetermined time and for resetting the predetermined time upon each subsequent reception of the trigger signal and for preventing the production of the control signal at the expiration of the predetermined time. The timer means 30 includes retriggerable monostable timer for producing the control signal for the predetermined time and for resetting predetermined time in response to a subsequent reception of the trigger signal.

The assembly 10 includes control means 32, which includes the ON actuating means 18, for receiving the control signal to maintain the supply of power to the audio amplifier 12 while the control signal is present. The control means 32 is generally a bistable relay switch which is energized by the retriggerable monostable and connected to the power means 16.

The comparator means 26 includes a first comparator 34 for detecting a lower magnitude of the predetermined magnitude range or window, and a second comparator 36 for detecting an upper magnitude of the predetermined magnitude range or window to produce the control signal when the level signal is greater than the lower magnitude and less than the upper magnitude. The assembly 10 includes combining means 38 for receiving a control signals from the first 34 and second 36 comparators and OR'ing the signals to producing the trigger signal to the drive means 28.

In the preferred embodiment, the dual level comparator 26 monitors the modulated audio level derived from the typical FM receiver 20. Demodulation or rectification of the audio signal by the half wave rectifier 22 and then filtering 24 develops a varying voltage normally between 0.1 and 0.5 Vdc. Typical programming of voice or music signals includes periods of zero audio so that the rectified audio signal periodically falls outside the lower set point or magnitude 34 of the window comparator 26. Whenever the input level falls outside the window or magnitude range, the OR'ed comparator outputs go low, turning off a monitor means 40. This signal also appears the input of the retriggerable monostable timer 30 through the driver 28. Conversely, whenever the detected audio levels fall within the window set points, the one shot timer 30 is triggered to deliver a logical low output pulse of nominally 20 second duration, using the component values herein indicated. If the input trigger goes high within the predetermined time, the output stays low. The timer 30 output is connected directly to the off coil RL of a sensitive two coil bistable or magnetic latching relay of the control means 32. At the end of the timing intervals, the main power relay RL will be dropped out. The ON actuating means 18 provides the manual control of the on-state which is provided by a conventional momentary push button switch and OFF actuating means 42 provides for manual control of the off state which is also provided by a conventional momentary push button. Two input conditions will cause the timer 30 to time out, that is, not to be triggered. Absence of the audio signal input typically due to an end of a program material such as having a tape, disk, or record run out, causing the demodulated, rectified DC level signal to fall below the lower set point or magnitude of the comparator 26. Loss of the FM radio or IR carrier will create a substantial base band signal, which when demodulated, will fall outside the comparator window by being above the upper set point or magnitude. Typical base band noise is mutli-spectral and is often used as a substitute for white noise in testing of audio equipment, so that it mimics bonafide audio modulation but is greater in intensity.

A second independent channel 44 drives an amplifier mute signal from the second or upper level comparator 36 only, so that audio signals which result in demodulated DC level signals in excess of nominally 0.6 volts will mute the power amplifier 12. In actual use, it was discovered that FM wireless extension speakers would reproduce a very loud annoying rushing sound whenever the FM transmitter was disabled. This phenomena is commonly observed whenever any FM station goes off the air and is due to the base band signal. Only the presence of transmitted radio signals within the receiver band pass will yield full quieting. The second channel 44 includes a mute driver 46 for producing a mute signal when the level signal is greater than the higher set point or magnitude established by the second comparator 36. The mute signal is delivered to a muting circuit (not shown) of the amplifier 12, as is common in the art.

The power supply means 16 includes a battery 60, such as 12 volts, for supplying power. The battery 60 is directly connected to the relay RL to ground and through the ON 18 and OFF 42 switches. The battery 60 is connected through the relay contact SW of the control means 32 to a 9 volt positive regulator 62, integrated circuit L7809C, to supply 9 volts to the assembly 10 and device 12. When contact SW is open, no power is supplied and the assembly 10 does not operate.

As illustrated in FIG. 1, the more specific circuitry of the assembly 10 includes the FM receiver 20 producing the audio signal utilized at the input to the assembly 10. The amplifier 12 receives this audio signal and supplies the amplified audio signal to the audio transducer 14. The audio amplifier 12 includes a power input connection 50 for receiving the power signal from the voltage regulator 62 when the relay contact SW is closed. The audio signal is also received by a resistor R1 (10K ohm) connected to ground and a diode D1 (IN4148) comprising the half wave rectifier 22. The rectified signal is connected through resistor R2 (10K ohm) to ground and capacitor C1 (10 uF) to ground, comprising the filter 24, and to the input of the comparator 26. The first comparator 34 comprises an operational amplifier and receives the rectified signal at its inverting input and the reference voltage establishing the lower set point at its non-inverting input. The lower set point is established by a voltage divider circuit comprising a resistor R3 (820K ohm) connected between voltage regulator 62 and a resistor R4 (51K ohm) to resistor R5 (01K ohm) to ground. The non-inverting input is connected between resistors R4 and R5 to establish a lower set point of 0.1 volt. The second comparator 36 comprises an operational amplifier and receives the rectified signal at its non-inverting input and the upper set point at its inverting input. The upper set point is established by a connection between the resistors R3 and R4. Both comparators 34, 36 are powered by the voltage regulator 62. The output of both comparators 34, 36 are connected to OR'ing diodes D2, D3, whose outputs are connected to the driver means 28 and to the voltage regulator 62 through resistor R9 (10K ohm). The driver means 28 comprises a transistor Q1 (2N3904) having its base connected to the diodes D2, D3 and collector connected to voltage regulator 62 and emitter connected through the monitor 40 to resistor R6 (470 ohm) to ground. The monitor 40 is an LED which illuminates in the presence of the control signal. The emitter of transistor Q1 delivers the trigger signal to the timer 30. The timer 30 is a retriggerable monostable multivibrator (CD4047B). Pins 8 and 12 receive the trigger signal and are connected through resistor R7 (100K ohm) to ground. Pins 4 and 14 are connected to the voltage regulator 62 and pins 5, 6, 7 and 9 are connected to ground. Pin 1 is connected to capacitor C2 (0.47 uF) to pin 3, and pin 2 is connected through resistor R8 (10M ohm) to pin 3. Pin 11 produces the control signal to the control means 32 through a diode D4. The control means 32 comprises the coils RL connected between battery 60 through the ON 18 and OFF 42 actuating means or switches and to ground. While the audio signal is being received, the ON momentary push-button 18 is actuated which energizes relay coil RL closing contact SW which, in turn, supplies power to the assembly 10, and maintains power by the timer 30 energizing relay coil RL opening contact SW. When the audio signal discontinues and the timer 30 times out, relay coil RL will be deenergized by the absence of the control signal, disconnecting power from the assembly 10. Alternatively, while power is maintained to the assembly 10, the OFF momentary push-button 42 may be actuated causing opening os contact SW and discontinuance of power to the assembly 10 preventing production of the control signal.

The mute channel 46 includes a transistor Q2 (2N3904) receiving the output signal from the second comparator 36 through diode D5 at its base and connected to the voltage regulator 62 through resistor R11, and its collector connected to the voltage regulator 62 and its emitter producing the muting signal and connected through a resistor R10 (1M) to ground and capacitor C4 (1 uF) to ground.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims wherein reference numerals are merely for convenience and are not to be in any way limiting, the invention may be practiced otherwise than as specifically described.

What is claimed is:

1. A signal sensing assembly for sensing audio signals and supplying power signal to an amplifier (12) in response thereto, said assembly comprising; power supply means (16) for supplying power, input means (20) for supplying an audio signal, comparator means (26) for receiving and comparing said audio signal to a predetermined magnitude range to produce a trigger signal, retriggerable timer means (30) for receiving power and said trigger signal to produce a control signal for a predetermined time and for resetting said predetermined time upon each subsequent reception of said trigger signal and for preventing the production of said control signal at the expiration of said predetermined time period, control means for receiving said control signal to supply power to said timer means (30) and an amplifier (12) and including manually actuateable ON actuating means (18) for initiating power to said timer means (30) so that the control signal is produced in the presence of said audio signal.

2. An assembly as set forth in claim 1 further characterized by including the audio amplifier means for receiving said audio signal and producing an amplified audio signal.

3. An assembly as set forth in claim 2 further characterized by including muting means (44) responsive to said comparator means (26) for muting said audio amplifier (12).

4. An assembly as set forth in claim 3 further characterized by including rectifier means (22) for receiving and rectifying said audio signal to produce a signal for said comparator means (26).

5. A method of sensing audio signals and supplying power and the audio signal to an amplifier, the method including the steps of; rectifying an audio signal to produce a level signal, comparing the level signal to a predetermined magnitude range to produce a trigger signal, producing a control signal for a predetermined time upon reception of the trigger signal and power, manually supplying power momentarily to allow the production of the control signal in the presence of the audio signal and supplying power to an amplifier, maintaining the supply of power to the amplifier in response to the presence of the control signal for the predetermined time while preventing the production of the control signal at the expiration of the predetermined time.

6. A method as set forth in claim 5 further including comparing the level signal to a lower magnitude and producing a lower output signal when the level signal is greater than the lower magnitude.

7. A method as set forth in claim 6 further including comparing the level signal to an upper magnitude and producing an upper output signal when the level signal is less than the upper magnitude.

8. A method as set forth in claim 7 further including combining the upper and lower output signals to produce the control signal.

9. A method as set forth in claim 8 further including filtering out frequencies above a predetermined frequency of the rectified audio signal.

10. A method as set forth in claim 9 further including manually disconnecting power from the device (12) prior to the expiration of the predetermined time.

11. A method as set forth in claim 10 further including visually indicating the presence of the control signal.

12. A method as set forth in claim 11 further including muting the device when the level signal exceeds the upper magnitude.

13. A signal sensing assembly for sensing audio signals and supplying power signal to an amplifier (12) in response thereto, said assembly comprising; input means (20) for supplying an audio signal, and characterized by including processing means for receiving said audio signal and responsive to manual actuation for initiating the supply of power to the amplifier (12) and for maintaining the supply of power to the amplifier (12) in the presence of said audio signal for a predetermined time after the absence of said audio signal and discontinuing the supply of power to the amplifier (12) at the expiration of the predetermined time.

14. An assembly as set forth in claim 13 further characterized by said processing means including comparator means (26) for receiving and comparing said audio signal to a predetermined magnitude range to produce a trigger signal.

15. An assembly as set forth in claim 14 further characterized by said processing means including retriggerable timer means (30) for receiving power and said trigger signal to produce a control signal for a predetermined time and for resetting said predetermined time upon each subsequent reception of said trigger signal and for preventing the production of said control signal at the expiration of said predetermined time.

16. An assembly as set forth in claim 15 further characterized by including control means for receiving said control signal to supply power to said timer means (30) and the amplifier (12).

17. An assembly as set forth in claim 16 further characterized by including manually actuateable ON actuating means (18) for initiating power to said timer means (30) so that the control signal is produced in the presence of said audio signal.

18. An assembly as set forth in claim 17 further characterized by including OFF actuating means (42) for manually disconnecting power from said assembly (10) prior to expiration of said predetermined time.

19. A signal sensing assembly for sensing audio signals and supplying power to an amplifier (12) in response thereto, said assembly comprising: input means (20) for supplying an audio signal; comparator means (26) for receiving and comparing said audio signal to a predetermined magnitude to produce a trigger signal; timer means (30) for receiving said trigger signal to produce a control signal for a predetermined time while receiving power and preventing the production of said control signal at the expiration of said predetermined time period and in the absence of power; said assembly characterized by including control means (32) responsive to manual actuation for initially supplying power to an amplifier (12) and said timer means (30) so that said control signal is produced in the presence of said audio signal, and for maintaining the supply of power while receiving said control signal and discontinuing power to said timer means (30) and the amplifier (12) at the expiration of said control signal.

20. An assembly as set forth in claim 19 further characterized by including power supply means (16) for supplying power to said assembly and the amplifier (12).

21. An assembly as set forth in claim 20 further characterized by said control means (32) including switch means for closing in order to supply power to said assembly and the amplifier (12) during the predetermined time and opening to prevent the supply of power.

22. An assembly as set forth in claim 21 further characterized by said control means (32) including relay means (RL) receiving said control signal and closing contact means (SW) to supply power and opening said contact means (SW) in the absence of said control signal.

23. An assembly as set forth in claim 22 further characterized by including ON actuating means (18) for manually connecting power to said assembly and the amplifier (12).

24. An assembly as set forth in claim 23 further characterized by including OFF actuating means (42) for manually disconnecting power from said assembly prior to expiration of said predetermined time.

25. An assembly as set forth in claim 24 further characterized by including rectifier means (22) for receiving and rectifying said audio signal to produce a level signal for said comparator means (26).

26. An assembly as set forth in claim 25 further characterized by said timer means (30) including a retriggerable monostable timer for receiving the power and producing said control signal for said predetermined time and for resetting said predetermined time in response to a subsequent reception of said trigger signal.

27. An assembly as set forth in claim 26 further characterized by said comparator means (26) including a first comparator (34) for receiving said power and producing a first output signal when said level signal is greater than a lower magnitude of said predetermined magnitude range, and a second comparator (36) for receiving said power and producing a second output signal when said level signal is less than an upper magnitude of said predetermined magnitude range.

28. An assembly as set forth in claim 27 further characterized by including combining means (38) for receiving and ORing said output signals from said first and second comparators (34, 36) to produce control signals.

29. An assembly as set forth in claim 28 further characterized by including low pass filter means (24) for receiving said rectified signal and allowing frequency signals below a predetermined frequency to pass to be supplied to said comparator means (26).

30. An assembly as set forth in claim 29 further characterized by including driver means (28) for receiving said level signal and driving said retriggerable timer means (30).

31. An assembly as set forth in claim 30 further characterized by including monitor means (40) for receiving said control signal and visually indicating the presence of said control signal.

32. An assembly as set forth in claim 31 further characterized by including the amplifier (12) for receiving said audio signal and producing an amplified audio signal.

33. An assembly as set forth in claim 32 further characterized by including muting means (44) responsive to said second comparator (36) for receiving said second output signal from said second comparator (36) and muting said audio amplifier (12) in response to said second output signal.

34. An assembly as set forth in claim 33 further characterized by said rectifier means (22) including a half wave rectifier.

35. A method of sensing audio signals and supplying power and audio signals to a device, the method of including the steps of; manually supplying power momentarily to a device, maintaining the supply of power to the device in response to the presence of the audio signal for a predetermined time after the discontinuance of the audio signal, and discontinuing power to the device at the expiration of the predetermined time.

36. A signal sensing assembly for sensing audio signals and supplying power signal to a device in response thereto, said assembly comprising; power supply means (16) for supplying power, input means (20) for supplying an audio signal, comparator means (26) for receiving and comparing said audio signal to a predetermined magnitude range to produce a trigger signal, retriggerable timer means (30) for receiving power and said trigger signal to produce a control signal for a predetermined time and for resetting said predetermined time upon each subsequent reception of said trigger signal and for preventing the production of said control signal at the expiration of said predetermined time period, control means for receiving said control signal to supply power to said timer means (30) and a device and including manually actuateable ON actuating means (18) for initiating power to said timer means (30) so that the control signal is produced in the presence of said audio signal.

37. An assembly as set forth in claim 36 further characterized by including the device comprising audio amplifier means for receiving said audio signal and producing an amplified audio signal.

38. A signal sensing assembly for sensing audio signals and supplying power to a device in response thereto, said assembly comprising; input means (20) for supplying an audio signal, and characterized by including processing means for receiving said audio signal and responsive to manual actuation for initiating the supply of power to the device (12) and for maintaining the supply of power to the device (12) in the presence of said audio signal for a predetermined time after the absence of said audio signal and discontinuing the supply of power to the device at the expiration of the predetermined time.

39. An assembly as set forth in claim 38 further characterized by said processing means including comparator means (26) for receiving and comparing said audio signal to a predetermined magnitude range to produce a trigger signal.

40. An assembly as set forth in claim 39 further characterized by said processing means including retriggerable timer means (30) for receiving power and said trigger signal to produce a control signal for a predetermined time and for resetting said predetermined time upon each subsequent reception of said trigger signal and for preventing the production of said control signal at the expiration of said predetermined time.

41. An assembly as set forth in claim 40 further characterized by including control means for receiving said control signal to supply power to said timer means (30) and the device.

42. An assembly as set forth in claim 41 further characterized by including the device comprising an amplifier.

43. A signal sensing assembly for sensing audio signals and supplying power to a device in response thereto, said assembly comprising: input means (20) for supplying an audio signal; comparator means (26) for receiving and comparing said audio signal to a predetermined magnitude to produce a trigger signal; timer means (30) for receiving said trigger signal to produce a control signal for a predetermined time while receiving power and preventing the production of said control signal at the expiration of said predetermined time period and in the absence of power; said assembly characterized by including control means (32) responsive to manual actuation for initially supplying power to a device and said timer means (30) so that said control signal is produced in the presence of said audio signal, and for maintaining the supply of power while receiving said control signal and discontinuing power to said timer means (30) and the device at the expiration of said control signal.

* * * * *